United States Patent [19]
Izumi

[11] Patent Number: 5,916,364
[45] Date of Patent: Jun. 29, 1999

[54] METHOD AND APPARATUS FOR PULLING A SINGLE CRYSTAL

[75] Inventor: Teruo Izumi, Osaka pref., Japan

[73] Assignee: Sumitomo Sitix Corporation, Amagasaki, Japan

[21] Appl. No.: 08/930,361

[22] PCT Filed: Feb. 27, 1997

[86] PCT No.: PCT/JP97/00594

§ 371 Date: Jan. 8, 1998

§ 102(e) Date: Jan. 8, 1998

[87] PCT Pub. No.: WO97/32059

PCT Pub. Date: Sep. 4, 1997

[30] Foreign Application Priority Data

Feb. 29, 1996 [JP] Japan ................................. 8-043765
Feb. 29, 1996 [JP] Japan ................................. 8-043766

[51] Int. Cl.$^6$ .................................................. C30B 15/20
[52] U.S. Cl. .................................................. 117/13; 117/44
[58] Field of Search ................................. 117/13, 14, 15, 117/34, 35, 44, 217, 222

[56] References Cited

U.S. PATENT DOCUMENTS

| | | | |
|---|---|---|---|
| 3,853,596 | 12/1974 | Distler et al. ........................... | 117/69 |
| 4,659,421 | 4/1987 | Jewett ..................................... | 117/21 |
| 4,946,545 | 8/1990 | Engel et al. ........................... | 264/210.8 |
| 4,971,650 | 11/1990 | Spitznagel et al. ..................... | 117/904 |
| 5,292,487 | 3/1994 | Tatsumi et al. ......................... | 117/201 |
| 5,607,506 | 3/1997 | Phomsakha et al. ..................... | 117/33 |

*Primary Examiner*—Felisa Garrett
*Attorney, Agent, or Firm*—Armstrong Westerman Hattori McLeland & Naughton

[57] ABSTRACT

Methods and apparatuses for pulling a single crystal. In a conventional method for pulling a single crystal, a neck having a smaller diameter has been formed in order to exclude dislocation induced in dipping a seed crystal into a melt. But in pulling a heavy single crystal having a large diameter of 12 inches or more, the single crystal cannot be supported and falls. When the diameter of the neck is large enough to prevent the fall, the dislocation can not be excluded and propagates to the single crystal. In the present invention, using an apparatus for pulling a single crystal having a laser beam generator or an incoherent light generating-inducing apparatus, the temperature of the front portion of the seed crystal is gradually raised by being irradiated with the laser beam or the incoherent light, and then, the seed crystal is dipped into the melt. As a result, the induction of the dislocation to the seed crystal caused by a thermal stress is prevented. Then, the single crystal is pulled without forming a neck. Therefore, a heavy single crystal can be pulled. The methods and the apparatuses for pulling a single crystal are used for pulling a single crystal ingot such as an upsized silicon single crystal.

17 Claims, 9 Drawing Sheets

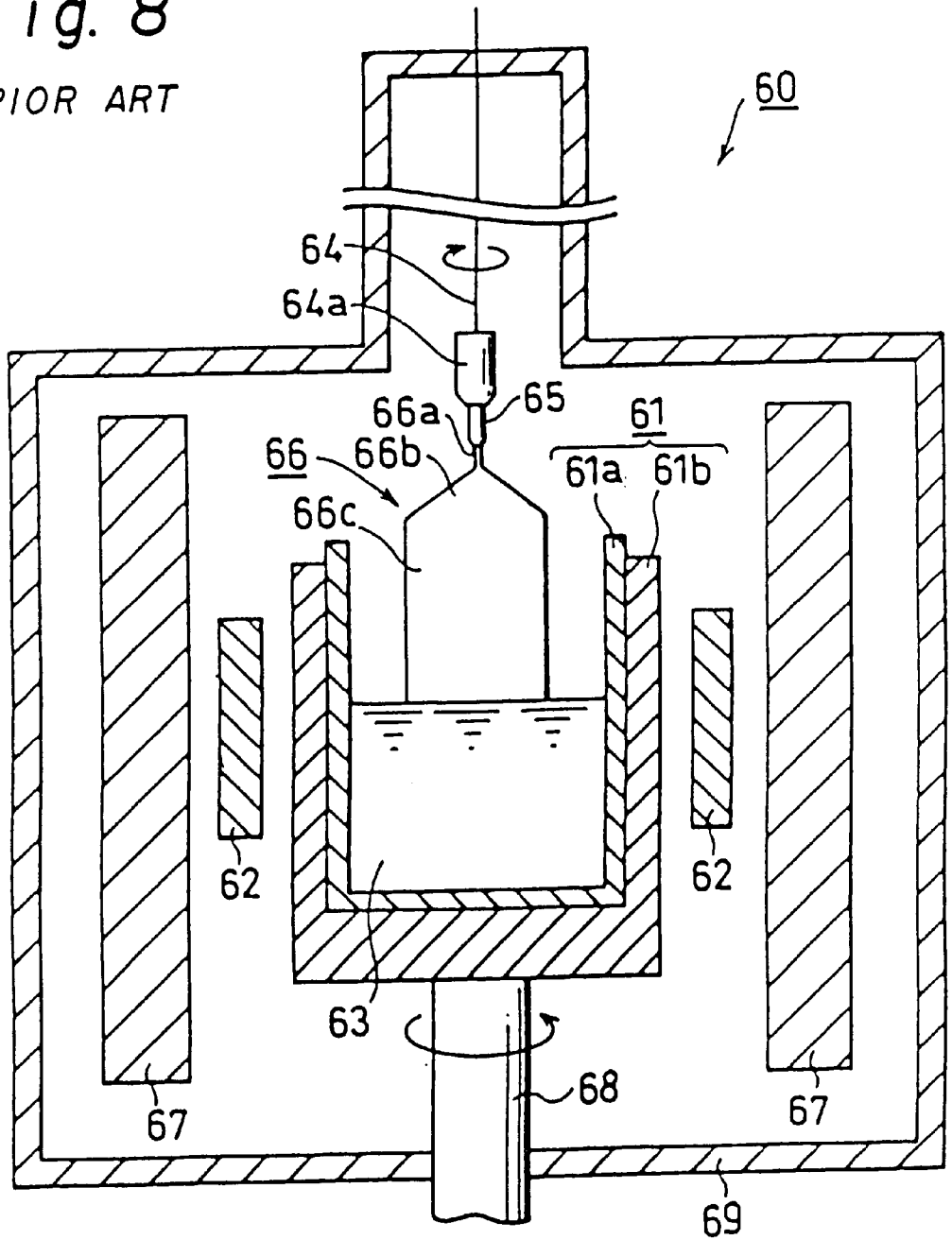

METHOD AND APPARATUS FOR PULLING A SINGLE CRYSTAL

TECHNICAL FIELD

The present invention relates to methods and apparatus for pulling a single crystal and, more particularly, to methods and apparatus for pulling a single crystal wherein a single crystal of silicon or the like is pulled by a pulling method such as the Czochralski method (hereinafter, referred to as the CZ method).

BACKGROUND ART

At present, as the majority of silicon single crystal ingots used for manufacturing a substrate for forming a circuit component of a LSI (large scale integrated circuit) and the like, silicon single crystals pulled by the CZ method have been used. FIG. 8 is a diagrammatic sectional view of a conventional apparatus for pulling a single crystal used for the CZ method, and in the figure, reference numeral 61 represents a crucible.

The crucible 61 comprises a bottomed cylindrical quartz crucible 61a and a bottomed cylindrical graphite crucible 61b fitted on the outer side of the quartz crucible 61a and supporting the quartz crucible 61a. The crucible 61 is supported with a support shaft 68 which rotates in the direction shown by the arrow in the figure at a prescribed speed. A cylindrical heater 62 of a resistance heating type and a cylindrical heat insulating mould 67 are concentrically arranged around the crucible 61. The crucible 61 is charged with a melt 63 of a material for forming a crystal which is melted by the heater 62. On the central axis of the crucible 61, a pulling axis 64 made of a pulling rod or wire is suspended, and at the lower end portion thereof, a seed crystal 65 is held by a holder 64a. Each part mentioned above is arranged at a fixed place in a water cooled type chamber 69 wherein pressure and temperature can be controlled.

A method for pulling a single crystal 66 using the above-mentioned apparatus for pulling a single crystal is described below by reference to FIGS. 8 and 9. FIGS. 9(a)–(d) are partial magnified front views diagrammatically showing the seed crystal and the vicinity thereof in part of the steps in pulling a single crystal.

Although it is not shown in FIG. 9, the material for forming a crystal is melted by the heater 62. The pressure in the chamber 69 is reduced and is maintained for a period of time so as to sufficiently release gas contained in the melt 63. Then, an inert gas is induced into the chamber 69 from the upper part thereof so as to make an inert gas atmosphere under reduced pressure within the chamber 69.

While the pulling axis 64 is rotated on the same axis in the reverse direction of the support shaft 68 at a prescribed speed, the seed crystal 65 held by the holder 64a is caused to descend. The front portion 65a thereof is brought into contact with the surface of the melt 63 so as to make the seed crystal 65 partially melt into the melt 63 (hereinafter, referred to as the seeding step) (FIG. 9(a)).

In making a crystal grow at the front of the seed crystal 65, the pulling axis 64 is pulled at a higher speed than the below-described pulling speed in forming a main body 66c. The crystal is narrowed down to have a prescribed diameter, leading to the formation of a neck 66a (hereinafter, referred to as the necking step) (FIG. 9(b)).

By slowing down the pulling speed of the pulling axis 64 (hereinafter, simply referred to as the pulling speed), the neck 66a is made to grow to have a prescribed diameter, leading to the formation of a shoulder 66b (hereinafter, referred to as the shoulder formation step) (FIG. 9(c)).

By pulling the pulling axis 64 at a fixed rate, the main body 66c having a uniform diameter and a prescribed length is formed (hereinafter, referred to as the main body formation step) (FIG. 9(d)).

Although it is not shown in FIG. 9, in order to prevent induction of high density dislocation to the single crystal 66 by a steep temperature gradient, the diameter thereof is gradually decreased and the temperature of the whole single crystal 66 is gradually lowered, leading to the formation of an end-cone and a tail end. Then, the single crystal 66 is separated from the melt 63. Cooling the single crystal 66 is at the end of the pulling of the single crystal 66.

One of the most important steps in the pulling of the single crystal 66 is the above-mentioned necking step (FIG. 9(b)). In the seeding step (FIG. 9(a)), the front portion 65a of the seed crystal 65 is preheated to some extent and is brought into contact with the melt 63. There is usually a difference of 100° C. or more between the preheating temperature (about 1300° C. and less) and the melting point of the seed crystal 65 (about 1410° C.). Therefore, in dipping the seed crystal 65 into the melt 63, the seed crystal 65 has a steep temperature gradient, leading to the induction of the dislocation caused by a thermal stress to the front portion 65a of the seed crystal 65. It is necessary to make the single crystal 66 grow after excluding the dislocation which inhibits single crystal growth. Since the dislocation generally tends to grow in the vertical direction to the growth interface of the single crystal 66, the shape of the growth interface (the front plane of the neck 66a) is made to be downward convex in the necking step, so as to exclude the dislocation.

In the necking step, the faster the pulling speed is made, the smaller the diameter of the neck 66a becomes and the more downward convex the shape of the growth interface becomes. As a result, the dislocation is inhibited from propagating and can be efficiently excluded.

In the above conventional method for pulling a single crystal, the seed crystal 65 having a diameter of about 12 mm has been generally used in order to pull the single crystal 66 having a diameter of about 6 inches and a weight of 80 kg or so. The larger diameter of the neck 66a is, the more safely the single crystal 66 is held, while the smaller diameter of the neck 66a is, the more efficiently the dislocation is excluded. In order to meet both of the requirements, the neck 66a having a diameter of about 3 mm is selected.

Recently, however, in order to produce a single crystal ingot at a lower cost and more efficiently, and to improve the yield of chips, the wafer has been required to have a larger diameter. Now, for example, the production of the single crystal 66 having a diameter of about 12 inches (300 mm) and a weight of 300 kg or so is desired. In this case, the neck 66a having a conventional diameter (usually 3 mm or so) cannot withstand the weight of the pulled single crystal 66 and breaks, resulting in the falling of the single crystal 66.

In growing the above heavy single crystal 66, the diameter of the neck 66a needs to be about 6 mm or more in order to prevent the occurrence of troubles such as a fall of the single crystal 66 and to pull the single crystal 66 safely, which is calculated from the silicon strength (about 16 kgf/mm$^2$). However, when the diameter of the neck 66a is 6 mm or more, the dislocation induced in dipping the seed crystal 65 into the melt 63 cannot be sufficiently excluded, leading to the induction of the dislocation to the pulled single crystal 66.

DISCLOSURE OF INVENTION

The present invention has been developed in order to solve the above problems, and it is an object of the present invention to provide methods and apparatus for pulling a single crystal, wherein even a heavy single crystal can be pulled safely and at low cost by preventing induction of dislocation to a seed crystal itself and omitting the necking step in dipping the seed crystal into a melt so as to make the single crystal grow from the front portion of the seed crystal.

In order to achieve the above object, a method for pulling a single crystal (1), wherein a single crystal is made to grow by dipping a seed crystal into a melt within a crucible and then, pulling the seed crystal, is characterized by dipping the seed crystal into the melt after the temperature of the front portion of the seed crystal is gradually raised using an auxiliary heating means and pulling the single crystal without forming a neck.

In the method for pulling a single crystal (1), the front portion of the seed crystal is heated close to the temperature of the melt before dipping the seed crystal into the melt, leading to no sudden change in temperature (thermal shock) and the prevention of the induction of dislocation in dipping the seed crystal into the melt. As a result, the single crystal can be pulled without propagating the dislocation even if no neck is formed. Even when a heavier single crystal than before is pulled, the single crystal can be sufficiently supported. Since a neck need not be formed, the size of the whole seed crystal can be smaller than that used in the conventional method, resulting in the use of an inexpensive seed crystal, and in the reduction of the cost of pulling a single crystal.

A method for pulling a single crystal (2), which is carried out according to the method for pulling a single crystal (1), is characterized by dipping the seed crystal into the melt after the temperature of the seed crystal, whose front portion is 1300° C. or more, is raised to 1380–1480° C. at a rate of 0.5–30° C./min using the auxiliary heating means.

In the method for pulling a single crystal (2), since the seed crystal is dipped into the melt after the temperature of the seed crystal, whose front portion is 1300° C. or more, is raised to 1380–1480° C. at a relatively slow rate of 0.5–30° C./min, the temperature of the seed crystal does not have a wide distribution. As a result, the seed crystal can be brought into contact with the melt without inducing the dislocation to the seed crystal, the single crystal can be pulled without propagating the dislocation even if no neck is formed, and a heavier single crystal than before can be pulled at low cost.

A method for pulling a single crystal (3), wherein a single crystal is made to grow by dipping a seed crystal into a melt within a crucible and then, pulling the seed crystal, is characterized by dipping the seed crystal into the melt after the temperature of the seed crystal is raised close to that of the melt by preheating the seed crystal with a heat insulating tube arranged around it, and pulling the single crystal without forming a neck.

In the method for pulling a single crystal (3), the seed crystal is sufficiently preheated with efficiency by isolating a flow of an inert (Ar) gas in the vicinity of the seed crystal using the heat insulating tube, and the temperature of the seed crystal is raised close to that of the melt before dipping the seed crystal into the melt, leading to the prevention of induction of dislocation caused by a thermal shock in dipping the seed crystal into the melt. Therefore, even if no neck is formed, the single crystal can be pulled without propagating the dislocation, and a heavier single crystal than before can be pulled at low cost.

A method for pulling a single crystal (4), which is carried out according to the method for pulling a single crystal (3), is characterized by preheating the seed crystal additionally using the auxiliary heating means described in the method for pulling a single crystal (1).

In the method for pulling a single crystal (4), in addition to the preheating of the seed crystal with the heat insulating tube, the front portion of the seed crystal can be heated by the auxiliary heating means. Since heat does not easily diffuse around from the seed crystal due to the existence of the heat insulating tube, the temperature of the front portion of the seed crystal can be raised more efficiently.

A method for pulling a single crystal (5), which is carried out according to the method for pulling a single crystal (1), (2), or (4), is characterized by raising the temperature of the seed crystal using a laser beam.

In the method for pulling a single crystal (5), the temperature of the seed crystal is raised using the laser beam. Since the laser beam can be easily focused at the front portion of the seed crystal, the temperature of the front portion thereof can be raised easily and efficiently.

A method for pulling a single crystal (6), which is carried out according to the method for pulling a single crystal (1), (2), or (4), is characterized by raising the temperature of the seed crystal using an incoherent light.

A method for pulling a single crystal (7), which is carried out according to the method for pulling a single crystal (6), is characterized by using the incoherent light having a wave length of 0.6 μm or more.

In the method for pulling a single crystal (6) or (7), since the seed crystal is heated using the incoherent light, the seed crystal can be preheated economically using a relatively inexpensive apparatus. When an incoherent light having a wave length of 0.6 μm or more is used, the seed crystal can be uniformly heated much more easily.

An apparatus for pulling a single crystal (1), wherein a holder for holding a seed crystal is connected to a pulling axis, is characterized by having an auxiliary heater for raising the temperature of the front portion of the seed crystal before dipping the seed crystal held by the holder into a melt.

Using the apparatus for pulling a single crystal (1), the temperature of the front portion of the seed crystal can be easily raised close to that of the melt by the auxiliary heater before dipping the seed crystal into the melt, and the induction of dislocation caused by a thermal shock in dipping the seed crystal into the melt can be prevented. Therefore, the single crystal can be pulled without propagating the dislocation even if no neck is formed.

An apparatus for pulling a single crystal (2), defined in the apparatus for pulling a single crystal (1), is characterized by having a laser beam generator as the auxiliary heater and having a window portion formed for inducing a laser beam emitted from the laser beam generator to the seed crystal.

Using the apparatus for pulling a single crystal (2), the seed crystal can be irradiated with the laser beam through the window portion from the outside of the body of the apparatus. As a result, without extensively modifying a conventional apparatus for pulling a single crystal, the seed crystal can be heated surely and efficiently.

An apparatus for pulling a single crystal (3), defined in the apparatus for pulling a single crystal (1), is characterized by having an incoherent light generating-inducing apparatus as the auxiliary heater, comprising an incoherent light generator and an inducing means for inducing an incoherent light generated by the incoherent light generator to the vicinity of the seed crystal.

Using the apparatus for pulling a single crystal (3), which has the incoherent light generating-inducing apparatus as the auxiliary heater, comprising the incoherent light generator and the inducing means, the front portion of the seed crystal can be heated through the inducing means even if the incoherent light generator is not arranged within the body of the apparatus for pulling a single crystal. Therefore, the seed crystal can be heated efficiently and at low cost.

An apparatus for pulling a single crystal (4), defined in the apparatus for pulling a single crystal (3), is characterized by having infrared ray generating-inducing apparatus as the auxiliary heater, comprising infrared ray generator and an inducing means for inducing infrared rays generated by the infrared ray generator to the vicinity of the seed crystal.

Using the apparatus for pulling a single crystal (4), the single crystal can be pulled at lower cost due to the use of the inexpensive infrared ray generating-inducing apparatus.

An apparatus for pulling a single crystal (5), defined in the apparatus for pulling a single crystal (3) or (4), is characterized by having the inducing means which includes a cylindrical body made of a material selected from among quartz, sapphire, kovar glass, $CaF_2$, NaCl, KCl, KBr, CsBr, and CsI.

Using the apparatus for pulling a single crystal (5), since the cylindrical body can be passed through by the incoherent light (infrared rays), the incoherent light (infrared rays) generated by the incoherent light (infrared rays) generator can be efficiently induced to the front portion of the seed crystal, which can be efficiently heated.

An apparatus for pulling a single crystal (6), defined in the apparatus for pulling a single crystal (5), is characterized by the cylindrical body constituting the inducing means, which has a diameter with a ratio of 1–3 to that of the front portion of the seed crystal.

Using the apparatus for pulling a single crystal (6), since the diameter of the cylindrical body is appropriately prescribed, the front portion of the seed crystal can be preheated more efficiently.

An apparatus for pulling a single crystal (7), wherein a holder for holding a seed crystal is connected to a pulling axis, is characterized by having a heat insulating tube surrounding the seed crystal, which is attached to the holder.

Using the apparatus for pulling a single crystal (7), a flow of an inert (Ar) gas in the vicinity of the seed crystal is isolated by the heat insulating tube so that the seed crystal is sufficiently preheated with efficiency. The temperature of the seed crystal can be raised close to that of the melt before dipping the seed crystal into the melt. As a result, the induction of dislocation caused by a thermal shock in dipping the seed crystal into the melt can be prevented, and the single crystal can be easily pulled without propagating the dislocation, even if no neck is formed.

An apparatus for pulling a single crystal (8), defined in the apparatus for pulling a single crystal (7), is characterized by having the auxiliary heater defined in the apparatus for pulling a single crystal (1).

Using the apparatus for pulling a single crystal (8), in addition to the preheating of the seed crystal with the heat insulating tube, the front portion of the seed crystal can be heated by the auxiliary heater. Since heat does not easily diffuse around due to the existence of the heat insulating tube, the front portion of the seed crystal can be heated more efficiently.

An apparatus for pulling a single crystal (9), defined in the apparatus for pulling a single crystal (7), is characterized by having the heat insulating tube whose front portion is located at a lower level than that of the seed crystal held by the holder.

An apparatus for pulling a single crystal (10), defined in the apparatus for pulling a single crystal (8), is characterized by having the heat insulating tube whose front portion is located at a lower level than that of the seed crystal held by the holder.

Using the apparatus for pulling a single crystal (9) or (10), since the front portion of the heat insulating tube is located at a lower level than that of the seed crystal held by the holder, the seed crystal can be more efficiently heat-insulated in the atmosphere isolated from the surroundings by the heat insulating tube before dipping the seed crystal into the melt, the seed crystal can be efficiently preheated, and the induction of the dislocation caused by the thermal shock can be more certainly prevented.

BRIEF DESCRIPTION OF DRAWINGS

FIG. 8 is a diagrammatic sectional view showing a conventional apparatus for pulling a single crystal used for the CZ method.

BEST MODE FOR CARRYING OUT THE INVENTION

The embodiments of the methods and the apparatus for pulling a single crystal according to the present invention are described below by reference to those Figures. The methods and the apparatus for pulling a single crystal according to the embodiments are described on the assumption that a heavy single crystal having a large diameter of 12 inches or more is pulled.

Figure 1:
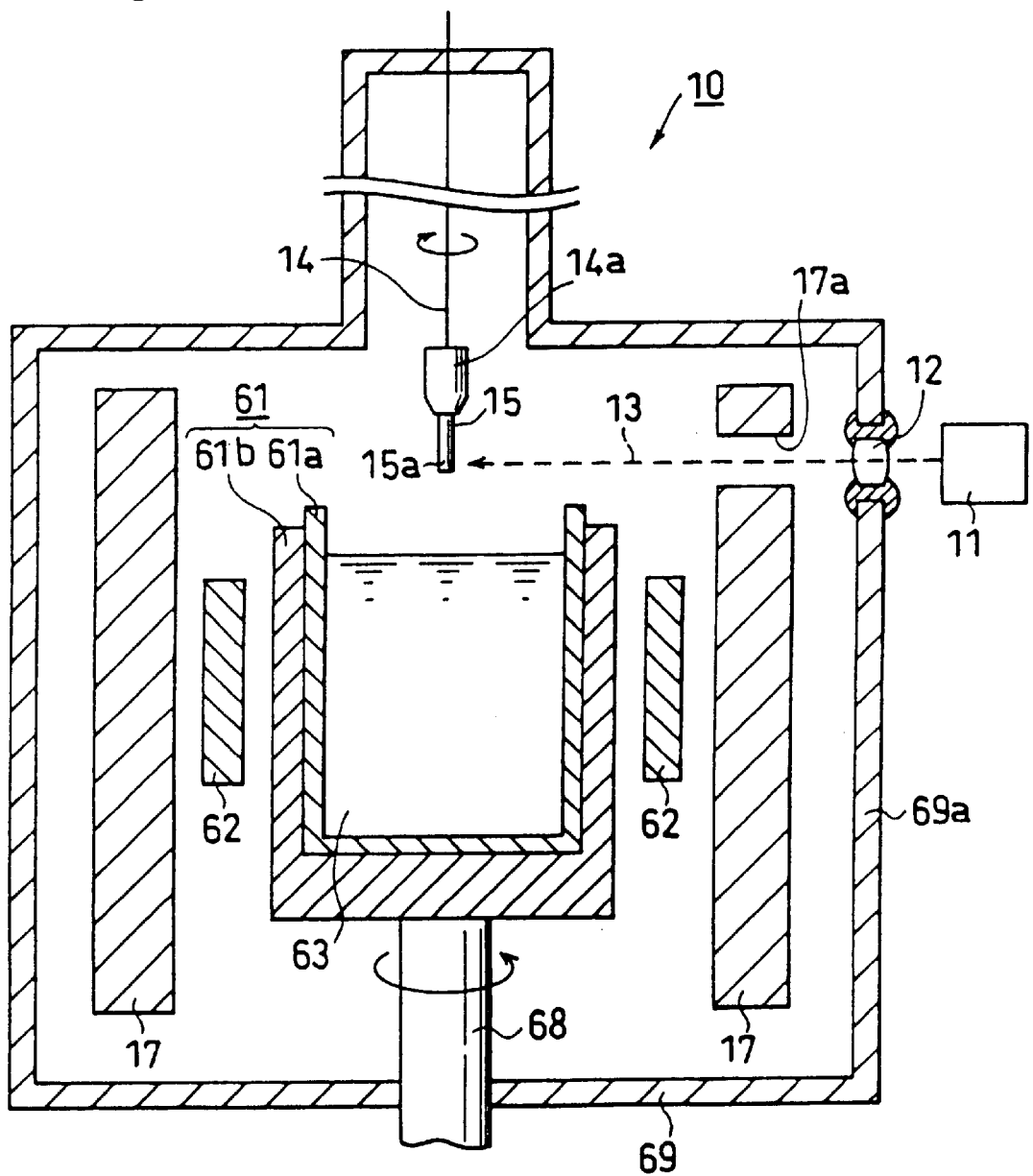
FIG. 1 is a diagrammatic sectional view showing an apparatus for pulling a single crystal according to embodiment (1) of the present invention.

FIG. 1 is a diagrammatic sectional view showing an apparatus for pulling a single crystal according to the embodiment (1).

The apparatus 10 for pulling a single crystal according to the embodiment (1) is similar to the conventional apparatus 60 for pulling a single crystal shown in FIG. 8 except for having a laser beam generator 11 as an auxiliary heater and having a window portion 12 on the apparatus 10 for pulling a single crystal for inducing a laser beam 13 emitted from the laser beam generator 11 to a seed crystal 15. Accordingly, here, only the parts related to the laser beam generator 11 are described.

The laser beam generator 11 is arranged outside a chamber 69, and on a side wall 69a thereof, the window portion 12 for inducing the laser beam 13 emitted from the laser beam generator 11 into the chamber 69 is arranged. On a heat insulating mould 17, a window (through hole) 17a for allowing the laser beam 13 to pass through is formed. The laser beam 13 emitted from the laser beam generator 11 passes through the window portion 12 and the window (through hole) 17a formed on the heat insulating mould 17, and the front portion 15a of the seed crystal 15 is irradiated with the laser beam 13 and is heated.

As a laser used in the laser beam generator 11, an excimer laser such as ArF laser and KrF laser, a $CO_2$ laser and a YAG laser are exemplified, and the power is preferably 0.05–500 W or so. When heating the seed crystal 15 by the laser beam 13, the seed crystal 15 is rotated at a speed of about 20 rpm in order to prevent only one point of the seed crystal 15 from being heated. In addition, the laser beam 13 is preferably scanned in a fixed field of the front portion 15a of the seed crystal 15 in order to heat the front portion 15a thereof more uniformly. The material for forming the window portion 12 arranged on the side wall 69a of the chamber 69 is not especially limited, as far as it is excellent in airtightness and heat resistance, and is pervious to the laser beam 13, but among such materials, a vitreous silica which sufficiently satisfies the conditions is desirable.

A method for pulling a single crystal according to the embodiment (1) is described below.

FIGS. 2(a)–(d) are partial magnified front views diagrammatically showing a seed crystal and the vicinity thereof in part of the steps in the method for pulling a single crystal according to the embodiment (1). A single crystal is pulled using the apparatus for pulling a single crystal 10 shown in FIG. 1.

The steps before the below-described steps are carried out in the same manner as described in the Prior Art.

While a pulling axis 14 is rotated on the same axis in the reverse direction of a support shaft 68 at a prescribed speed, the seed crystal 15 held by a holder 14a is caused to descend close to a melt 63 and is preheated. Then, the front portion 15a of the seed crystal 15 is heated by the laser beam 13 and the temperature thereof is raised (FIGS. 1 and 2(a)).

The diameter of the seed crystal 15 is preferably 6–30 mm. When the diameter thereof is less than 6 mm, it is difficult to support a single crystal 16 having a diameter of about 12 inches and a weight of more than 300 kg. On the other hand, when the diameter thereof is more than 30 mm, it is large enough to support the single crystal 16 but so large that using the seed crystal 15 is economically disadvantageous.

By spending 5–120 minutes or so on the preheating, the temperature of the front portion 15a of the seed crystal 15 rises to about 1200–1300° C. The distance between the melt 63 and the lower end of the seed crystal 15 at that time is preferably 1–30 mm or so. After the preheating, the front portion 15a of the seed crystal 15 is irradiated with the laser beam 13, and the temperature of the front portion 15a is raised. Here, when a high power of the laser beam 13 is emitted from the beginning, there is the possibility of induction of dislocation caused by a thermal shock to the seed crystal 15 due to a partial sudden change in temperature. Therefore, the power of the laser beam 13 is set low at first, and is gradually increased so as to allow the temperature to be raised gradually. Finally the temperature of the front portion 15a of the seed crystal 15 is raised to 1380–1480° C. The time for the temperature raising is preferably 10–120 minutes, and the rate of the temperature raising is preferably 0.5–30° C./min. When the rate thereof is less than 0.5° C./min, the time for the temperature raising of the front portion 15a is too long, leading to a reduction of productivity. On the other hand, when the rate thereof is more than 30° C./min, the dislocation is easily induced to the seed crystal 15 by the thermal shock due to the sudden change in temperature of the front portion 15a. When the temperature of the front portion 15a is less than 1380° C., the dislocation caused by the thermal stress is induced to the seed crystal 15 in bringing the seed crystal 15 into contact with the melt 63. On the other hand, when the temperature of the front portion 15a is more than 1480° C., the viscosity of the melted front portion 15a decreases, resulting in the fall of the front portion 15a. When the time for the temperature raising is less than 10 minutes, the dislocation caused by the thermal stress in the rise in temperature of the seed crystal 15 is easily induced. On the other hand, when the time for the temperature raising is more than 120 minutes, the time for the temperature raising is too long, leading to a reduction of production efficiency.

Figure 2A:
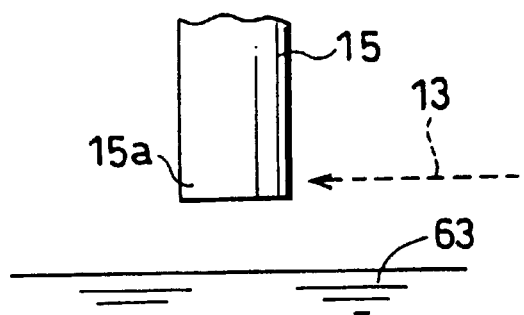
FIGS. 2(a)–(d) are partial magnified front views diagrammatically showing a seed crystal and the vicinity thereof in the method for pulling a single crystal according to the embodiment (1)
Figure 2B:
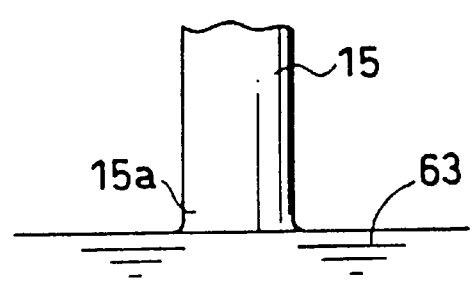
Figure 2C:
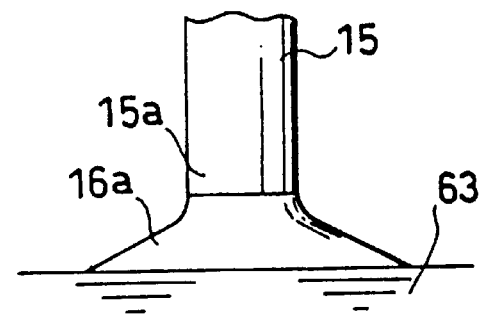

Then, the seed crystal 15 is caused to descend and the front portion 15a thereof is dipped into the melt 63 (FIG. 2(b)). In the dipping, since the difference between the temperature of the front portion 15a of the seed crystal 15 and that of the melt 63 is small, no thermal stress caused by the temperature difference occursin the seed crystal 15, resulting in no induction of the dislocation. Therefore, without forming a neck 66a (FIG. 9), the seed crystal 15 is pulled at a prescribed speed and the single crystal 16 is made to grow to have a prescribed diameter (12 inches or so), leading to the formation of a shoulder 16a (FIG. 2(c)).

Figure 2D:
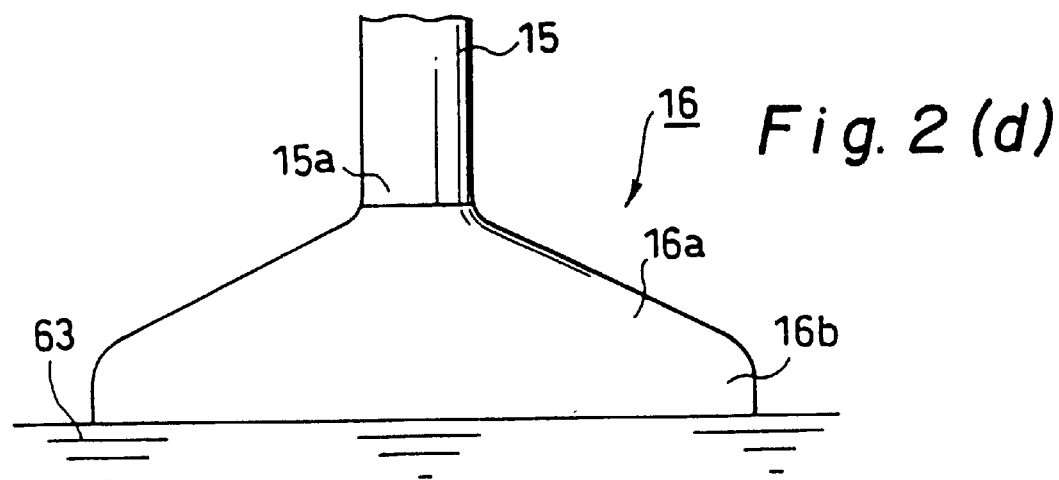

Then, the single crystal 16 is pulled at a prescribed speed, leading to the formation of a main body 16b (FIG. 2(d)).

Then, the single crystal 16 is pulled in the same manner as described in the Prior Art, is separated from the melt 63 and is cooled, which is the completion of the pulling of the single crystal 16.

A method and an apparatus for pulling a single crystal according to the embodiment (2) are described by reference to FIG. 3.

The apparatus for pulling a single crystal 20 according to the embodiment (2) is similar to the conventional apparatus for pulling a single crystal 60 shown in FIG. 8 except for having an infrared ray generating-inducing apparatus 21 as an auxiliary heater, comprising an infrared ray generator 22a generating an incoherent light within the wave length region of about 0.6–1000 $\mu$m (infrared region) and a quartz bar 22b which is an inducing means for inducing an infrared ray 25 generated by the infrared ray generator 22a to the vicinity of a seed crystal 15, and a sealing portion 23 arranged on the apparatus for pulling a single crystal 20 to seal the insert of the quartz bar 22b. Accordingly, here, only the parts related to the infrared ray generating-inducing apparatus 21 are described.

The infrared ray generator 22a is arranged outside a chamber 69, and the quartz bar 22b which induces the infrared rays 25 emitted from the infrared ray generator 22a to the vicinity of the seed crystal 15 is attached to the infrared ray generator 22a. The infrared ray generating-inducing apparatus 21 comprises the infrared ray generator 22a and the quartz bar 22b. The sealing portion 23 is formed on a side wall 69a of the chamber 69, the quartz bar 22b is inserted in the sealing portion 23 and a sealing material 24 for sealing the insert of the quartz bar 22b is arranged on the side wall 69a so as to keep airtightness. On a heat insulating mould 27, a notch 27a is formed to allow the quartz bar 22b to pass. As shown in FIG. 3, by making the quartz bar 22b slant so as to make the front portion 220b of the quartz bar 22b be located lower than the base portion thereof, the seed crystal 15 can be heated just above a melt 63, even if the level of the brim of a crucible 61 is much higher than that of the melt 63. As a material for the sealing material 24, inorganic adhesives and heat resisting resins are exemplified.

The incoherent light generated by the infrared ray generator 22a preferably has a wave length of 0.6 μm or more. When the wave length is less than 0.6 μm, only the surface of the seed crystal 15 and the vicinity thereof are heated. As a result, dislocation is easily induced by a thermal stress. As a source of the infrared rays, a tungsten halogen lamp, a tungsten-filament lamp, a Globar lamp and a Nernst glower are exemplified. The power is preferably 0.5–5 kW or so.

In heating the seed crystal 15 by the infrared rays 25, the seed crystal 15 is rotated at a speed of about 20 rpm in order not to make only one point of the seed crystal 15 heated. In order to heat the front portion 15a of the seed crystal 15 more uniformly, the front portion 15a of the seed crystal 15 is more preferably irradiated with the infrared rays 25 from plural directions (not shown) using plural infrared ray generating-inducing apparatus 21.

The ratio of the diameter of the quartz bar 22b to that of the seed crystal 15 is preferably 1–3. When the ratio of the diameter of the quartz bar 22b to that of the seed crystal 15 is less than 1, it is difficult to uniformly heat the seed crystal 15. As a result, the temperature of the seed crystal 15 has a wide distribution and the dislocation is easily induced. On the other hand, when the ratio of the diameter of the quartz bar 22b to that of the seed crystal 15 exceeds 3, the energy density of the irradiated infrared rays 25 decreases and the infrared rays 25 with which the seed crystal 15 are not irradiated increases, resulting in an economical disadvantage.

A method for pulling a single crystal 16 using the apparatus for pulling a single crystal 20 is almost similar to that according to the embodiment (1) except for using the infrared ray generating-inducing apparatus 21 as the auxiliary heater. Accordingly, here, the detailed description thereof is omitted.

In the embodiment (2), the method using the infrared ray generator 22a which generates an incoherent light having a wave length of about 0.6–1000 μm is described, but in an apparatus for pulling a single crystal according to another embodiment, an incoherent light generating-inducing apparatus, comprising an incoherent light generator which generates an incoherent light within the wave length region except the above, and an inducing means which induces the incoherent light generated by the incoherent light generator to the vicinity of the seed crystal 15, may be arranged.

In the embodiment (2), the quartz bar 22b is used as the inducing means, but in another embodiment, a cylindrical body made of sapphire, kovar glass, $CaF_2$, NaCl, KCl, KBr, CsBr, CsI or the like may be used. In this case, since the cylindrical body is inferior to the quartz bar 22b in heat resistance, it is necessary to cool the surroundings of the cylindrical body with a refrigerant. Accordingly, an apparatus for pulling a single crystal described below is used.

Figure 4:
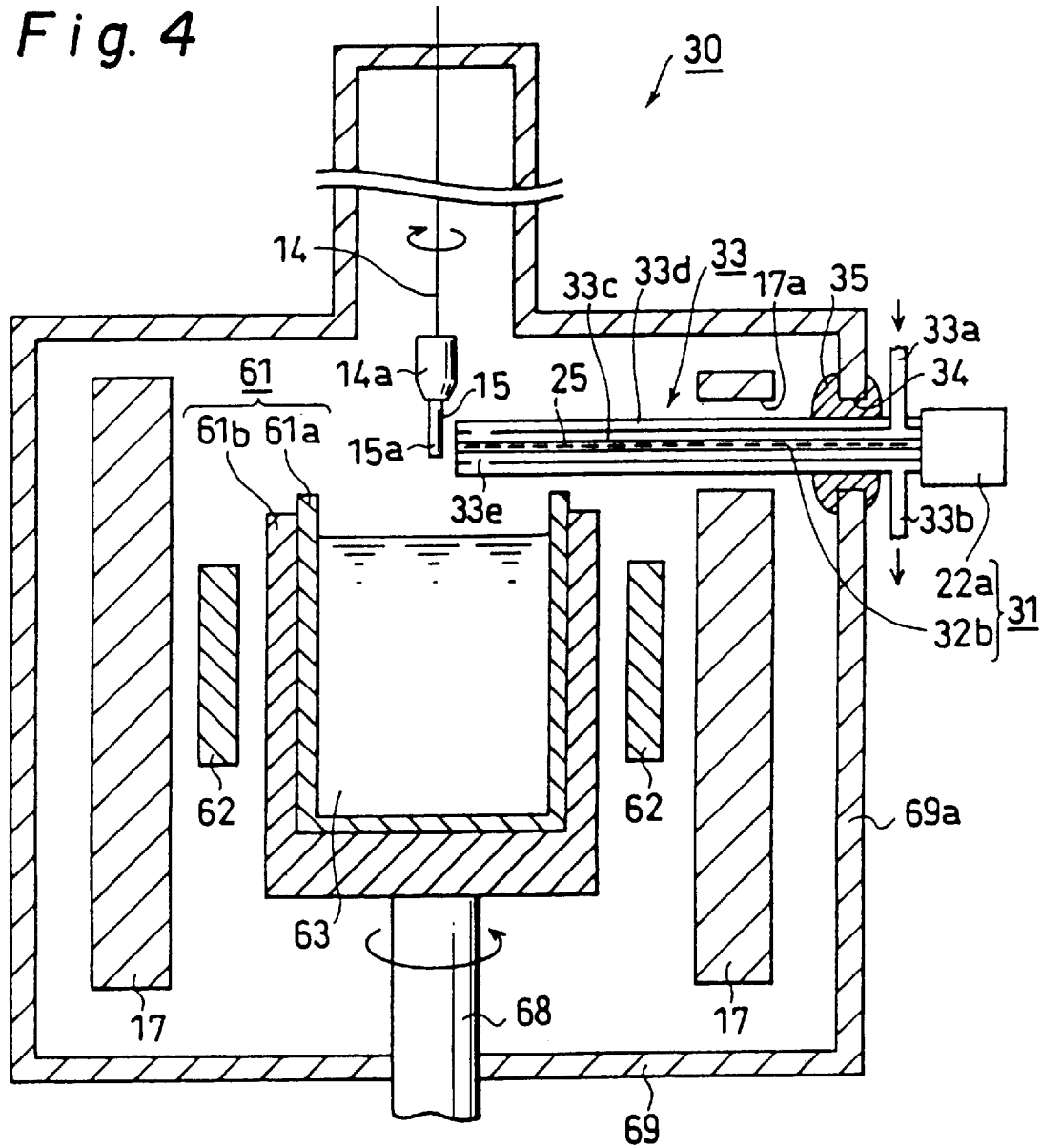
FIG. 4 is a diagrammatic sectional view showing an apparatus for pulling a single crystal according to embodiment (3)

FIG. 4 is a diagrammatic sectional view showing an apparatus for pulling a single crystal 30 according to the embodiment (3).

Figure 3:
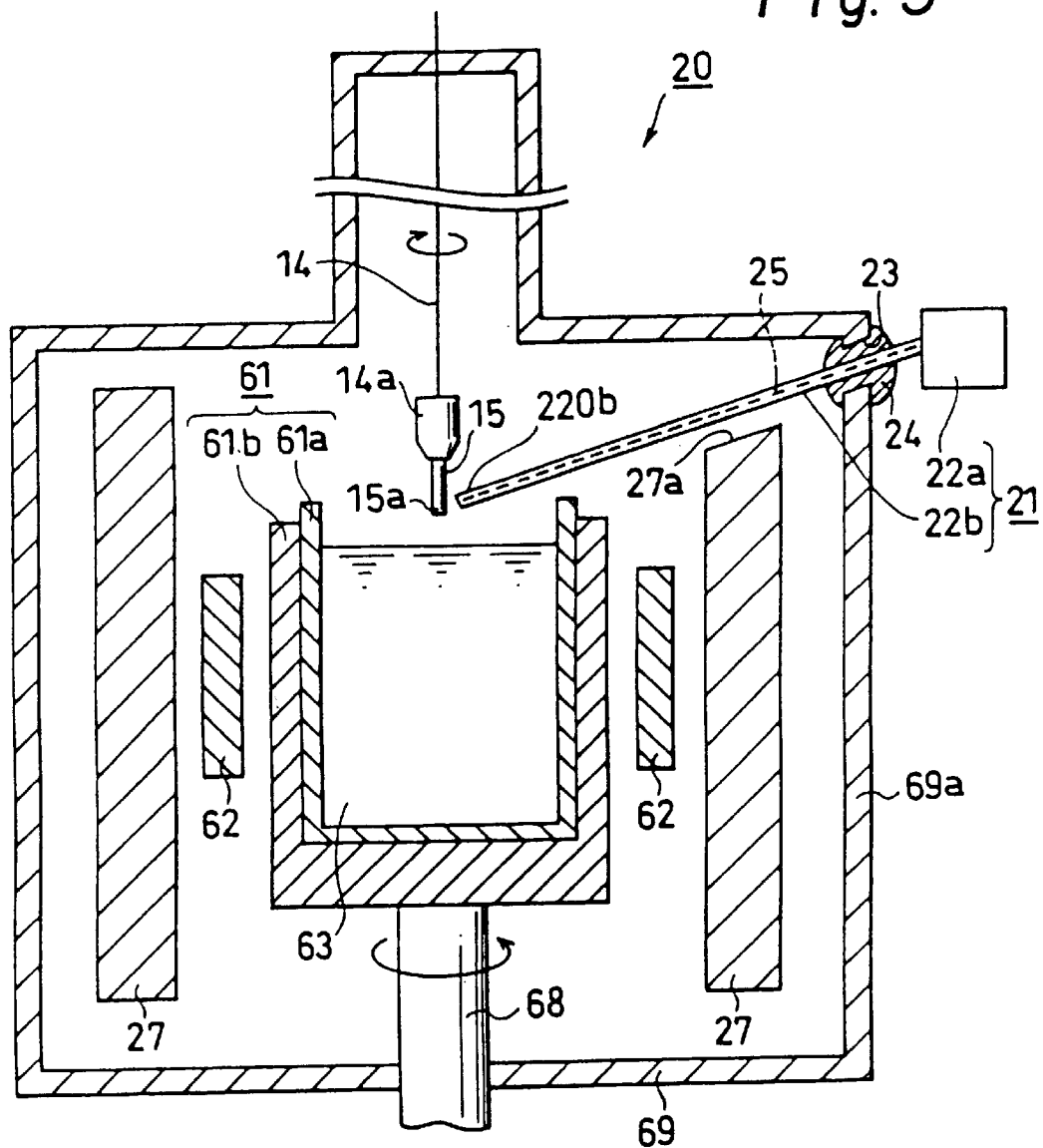
FIG. 3 is a diagrammatic sectional view showing an apparatus for pulling a single crystal according to embodiment (2)

The apparatus for pulling a single crystal 30 according to the embodiment (3) is similar to the apparatus for pulling a single crystal 20 shown in FIG. 3 except for using a kovar glass bar 32b as an inducing means constituting an auxiliary heater, having a protective tube 33 arranged around the kovar glass bar 32b to prevent the temperature of the kovar glass bar 32b from exceedingly rising, and inserting the kovar glass bar 32b and associated parts almost horizontally. Accordingly, here, only the parts related to the kovar glass 32b and the protective tube 33 are described.

The kovar glass bar 32b which induces an infrared ray 25 emitted from an infrared ray generator 22a to the vicinity of a seed crystal 15 is attached to the infrared ray generator 22a arranged outside a chamber 69, and an infrared ray generating-inducing apparatus 31 comprises the infrared ray generator 22a and the kovar glass bar 32b. The protective tube 33 is arranged around the kovar glass bar 32b, and has a double construction where an outertube 33d surrounds an innertube 33c, and a through hole 33e formed on the front portion thereof connects the innertube 33c with the outertube 33d. A refrigerant inlet 33a and a refrigerant outlet 33b are formed near the infrared rays generator 22a. Therefore, by inducing a refrigerant through the refrigerant inlet 33a, the refrigerant flows through the innertube 33c to the front portion to cool the kovar glass bar 32b. Then, the refrigerant passes through the through hole 33e and the outertube 33d, and passes through the refrigerant outlet 33b.

A sealing portion 34 is formed on a side wall 69a of the chamber 69, and the kovar glass bar 32b and the protective tube 33 arranged around it are inserted horizontally in the sealing portion 34. A sealing material 35 for sealing the insert of the protective tube 33 is arranged on the side wall 69a so as to keep the airtightness of the chamber 69. As a constituent of the protective tube 33, glass materials such as vitreous silica are exemplified, and as a refrigerant, heat-stable oil, water, and the like are exemplified.

A method and an apparatus for pulling a single crystal according to the embodiment (4) are described by reference to FIGS. 5 and 6. The apparatus for pulling a single crystal is similar to the conventional apparatus for pulling a single crystal 60 shown in FIG. 8 except for a quartz heat insulating tube 41 attached to a holder 44. Accordingly, here, only the constitution of the heat insulating tube 41 and the surroundings thereof is described.

Figure 6A:
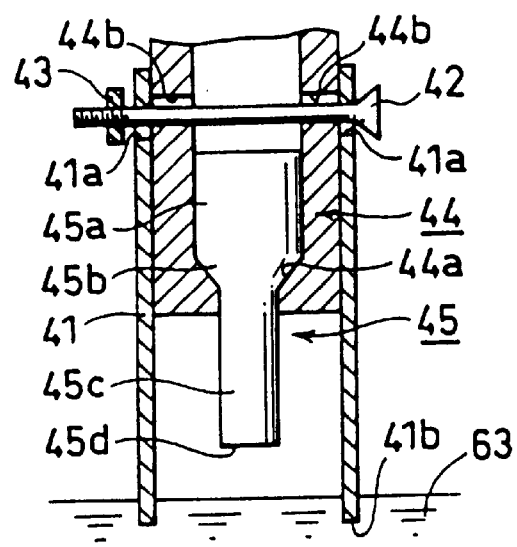
FIGS. 6(a)–(d) are partial magnified sectional views diagrammatically showing a seed crystal and the vicinity thereof in the method for pulling a single crystal according to the embodiment (4)
Figure 6B:
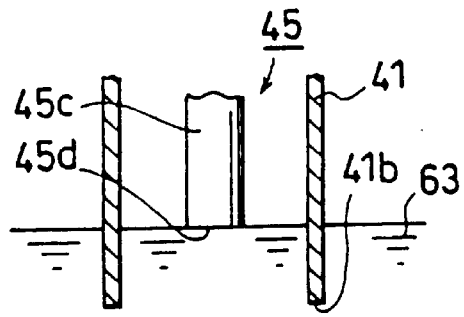
Figure 6C:
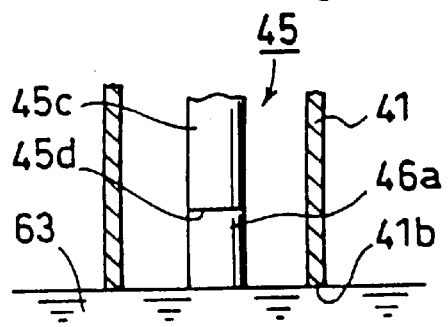
Figure 6D:
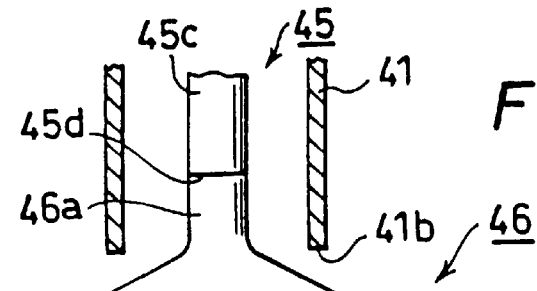

As shown in FIG. 6(a), the heat insulating tube 41 is cylindrical, and on the upper portion thereof, two through holes 41a are so formed that they vertically pierce the central axis. The graphite holder 44 is also almost cylindrical, but an oblique plane 44a as a supporting plane is formed in the void of the lower portion of the holder 44 to hold a seed crystal 45 so that the diameter of the void gradually decreases. In the middle portion of the holder 44, two through holes 44*b* are formed so that they vertically pierce the central axis. A groove is formed on the upper portion of the holder 44 (not shown) and a pulling axis 14 is screwed thereto. By making a connecting fastening 42 pierce the through holes 41*a* of the heat insulating tube 41 attached to the holder 44 and the through holes 44*b* of the holder 44, the heat insulating tube 41 is fastened to the holder 44. The connecting fastening 42 is made of graphite and shaped into the form of a bolt with a groove formed on the end portion thereof, and a nut 43 made of graphite is screwed thereto.

The seed crystal 45 comprises the upper portion 45*a*, which is a cylindrical portion having almost the same diameter as that of the void of the holder 44, the lower portion 45*c*, which is a cylindrical portion having a smaller diameter than the upper portion 45*a*, and the middle portion 45*b* having an oblique plane, which is formed between the upper portion 45*a* and the lower portion 45*c*. By inserting the seed crystal 45 from the void of the upper portion of the holder 44, the seed crystal 45 is held by the holder 44 in the state where the lower portion 45*c* is projecting from the holder 44. The lower end portion 41*b* of the heat insulating tube 41 is located at the lower level than the lower end portion 45*d* of the seed crystal 45 held by the holder 44. The material for forming the heat insulating tube 41 is not limited to quartz, but quartz, which is the same as the material for the quartz crucible 61*a*, preferably has few effects on the melt 63.

The method for pulling a single crystal according to the embodiment (4) is described below.

The steps before the below-described steps are carried out in the same manner as described in the Prior Art. Before the seeding step, the lower end portion 41*b* of the heat insulating tube 41 is located above the melt 63 as shown in FIG. 5.

While the pulling axis 14 is rotated on the same axis in the reverse direction of a support shaft 68 at a prescribed speed, the seed crystal 45 held by the holder 44 is caused to descend close to the melt 63 and preheated. At that time, the lower end portion 41*b* of the heat insulating tube 41 is dipped in the melt 63 (FIG. 6(*a*)).

Figure 5:
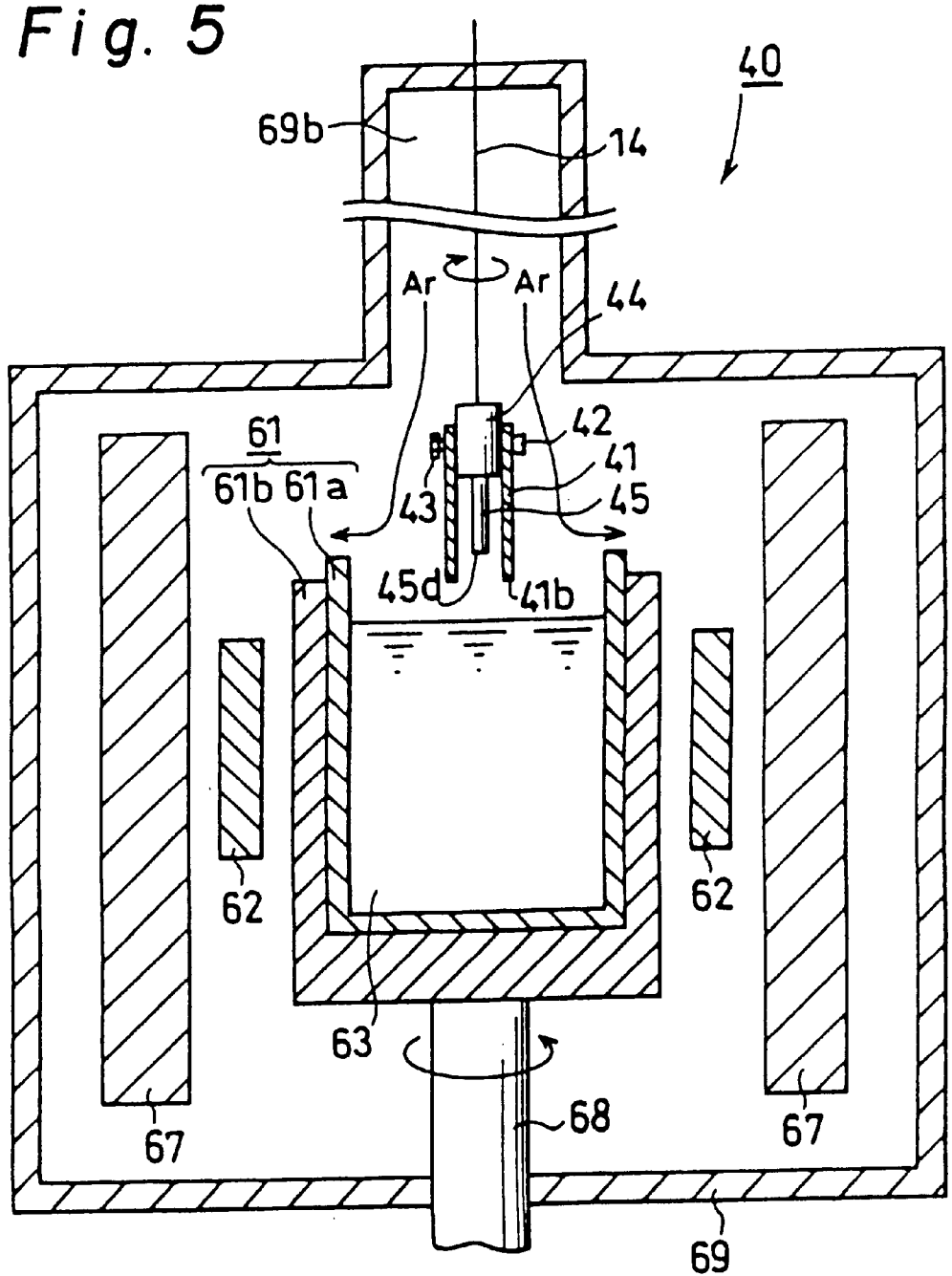
FIG. 5 is a diagrammatic sectional view showing an apparatus for pulling a single crystal according to embodiment (4)

In a chamber 69, as shown in FIG. 5, Ar gas is caused to flow in the direction of a crucible 61 from a pull chamber 69*b*. Hitherto, since the seed crystal 45 has been cooled by the flow of Ar gas, it has been difficult to raise the temperature of the seed crystal 45 close to that of the melt 63 only by preheating the seed crystal 45 located close to the melt 63. In the present embodiment, however, as shown in FIG. 6(*a*), the seed crystal 45 is perfectly insulated from the surrounding atmosphere by the heat insulating tube 41 and part of thermal radiation is also isolated. By preheating in such conditions, the temperature of the seed crystal 45 can be raised sufficiently close to that of the melt 63. The lower end portion 41*b* of the heat insulating tube 41 is preferably at a level of 2–30 mm lower than the lower end portion 45*d* of the seed crystal 45. When the lower end portion 41*b* of the heat insulating tube 41 is less than 2 mm lower than the lower end portion 45*d* of the seed crystal 45, it is difficult to dip only the lower end portion 41*b* of the heat insulating tube 41 into the melt 63 without bringing the seed crystal 45 into contact with the melt 63. On the other hand, when the lower end portion 41*b* of the heat insulating tube 41 is more than 30 mm lower than the lower end portion 45*d* of the seed crystal 45, it is difficult to sufficiently preheat the lower portion 45*c* of the seed crystal 45 due to the large distance between the lower end portion 45*d* of the seed crystal 45 and the melt 63, even in the state where the lower end portion 41*b* of the heat insulating tube 41 is dipped in the melt 63. In addition, from a viewpoint of efficient preheating, the heat insulating tube 41 preferably has an inner diameter of about 8–70 mm and a thickness of about 0.5–3 mm.

Then, the seed crystal 45 is caused to further descend and the lower end portion 45*d* thereof is brought into contact with the melt 63 (FIG. 6(*b*)). Here, on and after FIG. 6(*b*), the holder 44 is omitted, and only the lower portion 45*c* of the seed crystal 45, the heat insulating tube 41 existing around it, and the melt 63 are shown.

In bringing the seed crystal 45 into contact with the melt 63, the difference between the temperature of the lower portion 45*c* of the seed crystal 45 and that of the melt 63 is small, so that no thermal stress caused by a temperature difference affects the seed crystal 45, resulting in no induction of dislocation. Therefore, it is not necessary to form a neck 66*a* (FIG. 9), but when the formation step of a shoulder 46*b* is directly followed, the shoulder 46*b* sometimes hits on the heat insulating tube 41, since the heat insulating tube 41 exists around the lower end portion 45*d* of the seed crystal 45.

Then, once the seed crystal 45 is pulled at a prescribed speed and a single crystal (extended portion 46*a*) having almost the same diameter as the lower portion 45*c* of the seed crystal 45 is made to grow to almost the same level as that of the lower end portion 41*b* of the heat insulating tube 41 (FIG. 6(*c*)).

By pulling the seed crystal 45 at a prescribed speed, a single crystal 46 is made to grow to have a prescribed diameter (about 12 inches) so as to form the shoulder 46*b*, and then, by making the single crystal 46 grow at a prescribed pulling speed, a main body 46*c* is formed (FIG. 6(*d*)).

After that, in the same manner as described in the Prior Art, the single crystal 46 is pulled, is separated from the melt 63 and is cooled, which is the completion of the pulling of the single crystal 46.

Figure 7:
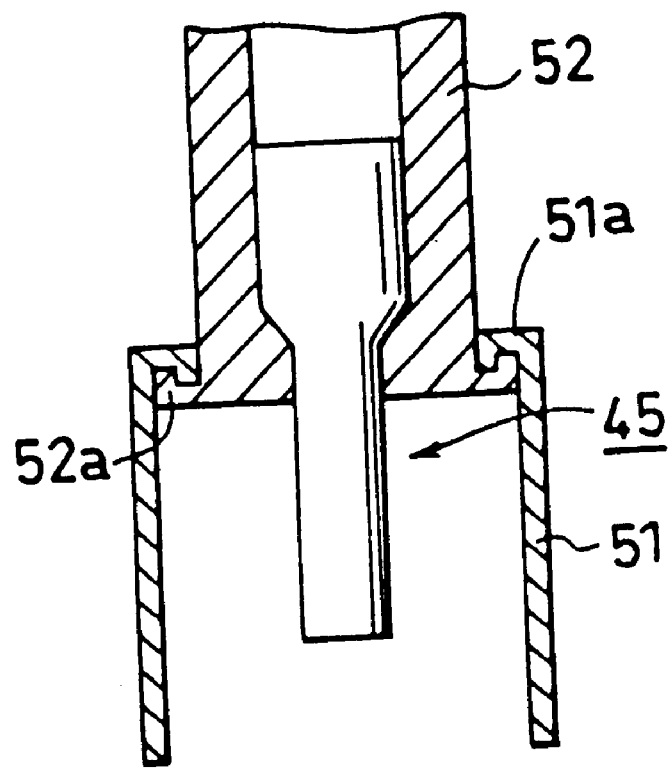
FIG. 7 is a partial magnified sectional view diagrammatically showing a holder and a seed crystal in an apparatus for pulling a single crystal according to embodiment (5)
Figure 9A:
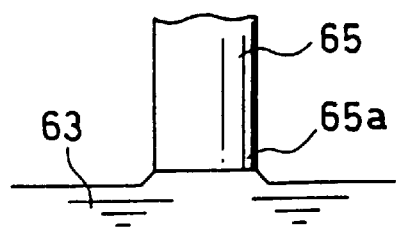
FIGS. 9(a)–(d) are partial magnified front views diagrammatically showing a seed crystal and the vicinity thereof in part of the steps in a conventional method for pulling a single crystal.
Figure 9B:
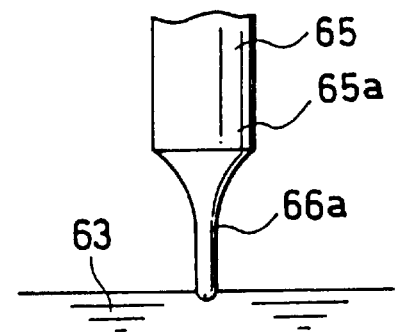
Figure 9C:
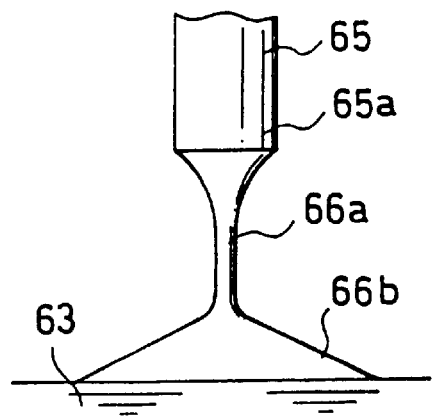
Figure 9D:
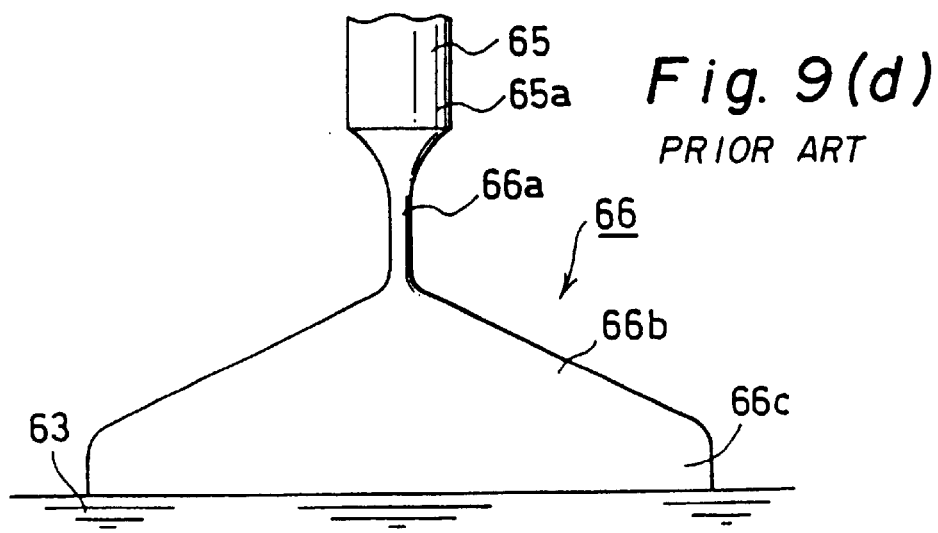

FIG. 7 is a diagrammatic sectional view showing a heat insulating tube and a holder which are constituents of an apparatus for pulling a single crystal according to the embodiment (5). The apparatus is similar to the apparatus for pulling a single crystal 40 according to the embodiment (4) except for the heat insulating tube and the holder. A method for pulling a single crystal according to the embodiment (5) is also similar to that according to the embodiment (4). Accordingly, here, only the construction of the heat insulating tube 51 and the holder 52 is described.

The holder 52, which has a hook portion 52*a* formed at the lower end thereof, holds the heat insulating tube 51 having a hook portion 51*a* formed at the upper end thereof by hooking the heat insulating tube 51 on the hook portion 52*a* of the holder 52. On the upper portion of the holder 52, a groove is formed (not shown), and a pulling axis 14 is screwed thereto. The form of a seed crystal 45 is similar to that in the embodiment (4).

In the embodiment (4) or (5), the apparatus for pulling a single crystal having the holder 44 or 52, to which the heat insulating tube 41 or 51 is attached, is described, but in an apparatus for pulling a single crystal according to another embodiment, the laser beam generator 11, the infrared ray generating-inducing apparatus 21 or 31, or the like described in the embodiments (1)–(3) may be attached in addition to the holder 44 or 52 with the heat insulating tube 41 or 51 attached thereto.

In this case, especially when the heat insulating tube 41 or 51 is made of quartz, which is pervious to the laser beam 13 and the infrared rays 25, the seed crystal 15 can be heated by the laser beam generator 11 or the infrared ray generating-inducing apparatus 21 or 31, and the temperature of the seed crystal 15 can be more efficiently raised due to the heat insulating tube 41 or 51 having an excellent heat insulation.

EXAMPLES

The methods and the apparatus for pulling a single crystal according to Examples are described below. As Comparative Examples, the cases wherein a single crystal is pulled by a conventional method using the conventional apparatus for pulling a single crystal used for the CZ method (FIG. 8) are described. The conditions and the results are shown below.

Examples 1 and 2, and Comparative Examples 1 and 2

Common Conditions to Examples 1 and 2, and Comparative Examples 1 and 2

Apparatus for pulling a single crystal used in Examples 1 and 2: Apparatus for pulling a single crystal 10 shown in FIG. 1

Shape of pulled single crystal 16 or 66
 Diameter: about 300 mm (12 inches)
 Length: about 1000 mm
 Weight: about 270 kg
Prepared quantity of material for crystal: 300 kg
Atmosphere in chamber 69: Ar atmosphere
 Flow of Ar: 80 liter per minute
 Pressure: $1.33 \times 10^3$ Pa
Rotation speed of pulling axis 14 or 64: 20 rpm
Rotation speed of crucible 61: 5 rpm
Number of pulls: ten times in each Example and Comparative Example

How to Examine DF (Dislocation Free) Rate of Pulled Single Crystal

The pulled single crystals 16 or 66 were sliced in parallel to the growth direction (length direction), and X-ray topographies of the obtained single crystals 16 or 66 were measured, from which the DF rate was judged. That is, the single crystals 16 or 66, in which dislocation was found even slightly from the X-ray topographies, were judged as having dislocation. The rate of dislocation-free single crystals (DF) in ten pulled single crystals was examined by the above measurement.

Results of Examples 1 and 2, and Comparative Examples 1 and 2

The conditions of Examples 1 and 2, and Comparative Examples 1 and 2 are shown in Tables 1 and 2, and the DF rates and the number of falls of the single crystals 16 and 66 are shown in Table 3.

TABLE 1

Pulling conditions of Examples 1 and 2

| | | In preheating | | Laser heating | | Shoulder | Main body |
|---|---|---|---|---|---|---|---|
| | Diameter of seed crystal (mm) | Distance between seed crystal lowest end and melt surface (mm) | Temperature of seed crystal front portion (° C.) | Temperature of heated portion (° C.) | Time for Temperature raising (min) | formation Pulling speed (mm/min) | formation Pulling speed (mm/min) |
| Example 1 | 10 | 1 | 1300 | 1430 | 60 | 0.3 | 0.5 |
| Example 2 | 6 | 1 | 1300 | 1430 | 60 | 0.3 | 0.5 |

TABLE 2

Pulling conditions of Comparative Examples 1 and 2

| | | In preheating | Necking | | | |
|---|---|---|---|---|---|---|
| | Diameter of seed crystal (mm) | Distance between seed crystal lowest end and melt surface (mm) | Pulling speed (mm/min) | Smallest diameter of neck (mm) | Shoulder formation Pulling speed (mm/min) | Main body formation Pulling speed (mm/min) |
| Comparative Example 1 | 12 | 1 | 3.0 | 4 | 0.3 | 0.5 |
| Comparative Example 2 | 12 | 1 | 4.0 | 10 | 0.3 | 0.5 |

TABLE 3

| | Results | |
|---|---|---|
| | DF rate (%) | Number of falls |
| Example 1 | 90% (9/10) | 0 (/10) |
| Example 2 | 90% (9/10) | 0 (/10) |
| Comparative Example 1 | 90% (9/10) | 8 (/10) |
| Comparative Example 2 | 0% (0/10) | 0 (/10) |

As obvious from the results shown in Table 3, in Examples 1 and 2, each DF rate of the pulled single crystals 16 was 90% (9/10). Little dislocation occurred due to no induction of the dislocation to the seed crystals 15, though the single crystals 16 were pulled without forming a neck 66a (FIG. 9). Since the diameters of the front portions 15a of the seed crystals 15 were sufficiently large, 10 mm and 6 mm, respectively in Examples 1 and 2, the number of falls was 0/10.

On the other hand, in Comparative Example 1, since the diameters of the seed crystals 15 were narrowed down to make the neck 66a have a diameter of 4 mm, the DF rate was favorably 90% (9/10). But the single crystals 66 could not be supported sufficiently, resulting in the number of falls of 8/10, that is, the falling of most of the single crystals 66. In Comparative Example 2, since the diameters of the necks 66a were sufficiently large, 10 mm, the number of falls was 0/10. But since the dislocation induced to the seed crystals 65 could not be excluded, the DF rate was 0% (0/10), that is, the dislocation occurred in all of the single crystals 66.

Examples 3–5

In Examples 3–5, the apparatus for pulling a single crystal 20 shown in FIG. 3 was used as an apparatus for pulling a single crystal. In this case, the shape of the pulled single crystal 16, prepared quantity of the material for forming a single crystal, atmosphere in the chamber 69, rotation speed of the pulling axis 14, rotation speed of the crucible 61, and number of pulls are similar to those in Examples 1 and 2. Examination of the DF (Dislocation Free) rate of the pulled single crystals is also similar to that in Examples 1 and 2.

Results of Examples 3–5 and Comparative Examples 3 and 4

The other conditions of Examples 3–5 except for the above are shown in Table 4, and the DF rates and numbers of falls of the single crystals 16 are shown in Table 5.

TABLE 5

| | Results | |
|---|---|---|
| | DF rate (%) | Number of falls |
| Example 3 | 90% (9/10) | 0 (/10) |
| Example 4 | 90% (9/10) | 0 (/10) |
| Example 5 | 90% (9/10) | 0 (/10) |

As obvious from the results shown in Table 5, in Examples 3–5, each DF rate of the pulled single crystals 16 was 90% (9/10). Little dislocation occurred due to no induction of the dislocation to the seed crystals 15, though the single crystals 16 were pulled without forming a neck 66a (FIG. 9). Since the diameters of the front portions 15a of the seed crystals 15 were sufficiently large, 10 mm, 6 mm, and 6 mm, respectively in Examples 3–5, the number of falls was 0/10.

Examples 6–8

In Examples 6–8, the apparatus for pulling a single crystal 40 shown in FIG. 5 was used as an apparatus for pulling a single crystal. In this case, the shape of the pulled single crystal 46, prepared quantity of the material for forming a single crystal, atmosphere in the chamber 69, rotation speed of the pulling axis 14, rotation speed of the crucible 61, and number of pulls are similar to those in Examples 1 and 2. Examination of the DF (Dislocation Free) rate of the pulled single crystals is also similar to that in Examples 1 and 2.

Results of Examples 6–8

The other conditions of Examples 6–8 except for the above are shown in Tables 6 and 7, and the DF rates and numbers of falls of the single crystals 46 are shown in Table 8.

TABLE 4

| | Pulling conditions of Examples 3–5 | | | | | | | |
|---|---|---|---|---|---|---|---|---|
| | | Wave | | In preheating | | Infrared heating | | Shoulder | Main body |
| | Diameter of seed crystal (mm) | length of infrared rays (μm) | Diameter of quartz bar (front) (mm) | Distance between seed crystal lowest end and melt surface (mm) | Temperature of seed crystal front portion (° C.) | Temperature of heated portion (° C.) | Rate of temperature raising (° C./min) | formation Pulling speed (mm/min) | formation Pulling speed (mm/min) |
| Example 3 | 10 | 0.6–5 | 15 | 1 | 1300 | 1430 | 5 | 0.3 | 0.5 |
| Example 4 | 6 | 0.6–5 | 10 | 1 | 1300 | 1430 | 5 | 0.3 | 0.5 |
| Example 5 | 6 | 0.6–5 | 10 | 1 | 1300 | 1400 | 5 | 0.3 | 0.5 |

TABLE 6

Pulling conditions of Examples 6–8

| | Heat insulating tube | | Diameter of seed crystal | Before dipping heat insulating tube Distance between seed | After dipping heat insulating tube | |
|---|---|---|---|---|---|---|
| | Inner diameter (mm) | Thickness (mm) | lower portion (mm) | crystal lower end and heat insulating tube lower end (mm) | Distance between seed crystal lower end and melt surface (mm) | Preheating time (min) |
| Example 6 | 12 | 2 | 10 | 2 | 1 | 60 |
| Example 7 | 12 | 2 | 6 | 2 | 1 | 60 |
| Example 8 | 12 | 2 | 6 | 21 | 20 | 60 |

TABLE 7

Pulling conditions of Examples 6–8

| | Extended portion | | Shoulder formation | Main body formation |
|---|---|---|---|---|
| | Pulling speed (mm/min) | Length (mm) | Pulling speed (mm/min) | Pulling speed (mm/min) |
| Example 6 | 0.8 | 3 | 0.3 | 0.5 |
| Example 7 | 0.8 | 3 | 0.3 | 0.5 |
| Example 8 | 0.8 | 23 | 0.3 | 0.5 |

TABLE 8

Results

| | DF rate (%) | Number of falls |
|---|---|---|
| Example 6 | 90% (9/10) | 0 (0/10) |
| Example 7 | 90% (9/10) | 0 (0/10) |
| Example 8 | 90% (9/10) | 0 (0/10) |

As is obvious from the results shown in Table 8, in Examples 6–8, each DF rate of the pulled single crystals 46 was 90% (9/10). Little dislocation occurred due to no induction of the dislocation to the seed crystals 45, though the single crystals 46 were pulled without forming a neck 66a (FIG. 9). Since the diameters of the lower portions 45c of the seed crystals 45 were sufficiently large, 10 mm, 6 mm and 6 mm, respectively in Examples 6–8, the number of falls was 0/10.

Industrial Applicability

The methods and the apparatus for pulling a single crystal according to the present invention are used for pulling a single crystal ingot such as an upsized silicon single crystal.

I claim:

1. A method for pulling a single crystal, comprising the steps of dipping a seed crystal into a melt within a crucible and pulling the seed crystal to make a single crystal grow, wherein the seed crystal is dipped into the melt after the temperature of the front portion of the seed crystal is gradually raised by an auxiliary heating means, and the single crystal is pulled without forming a neck.

2. A method for pulling a single crystal according to claim 1, wherein the seed crystal is dipped into the melt after the temperature of a seed crystal whose front portion is 1300° C. or more is raised to 1380–1480° C. at a rate of 0.5–30° C./min by the auxiliary heating means.

3. A method for pulling a single crystal, comprising the steps of dipping a seed crystal into a melt within a crucible and pulling the seed crystal to make a single crystal grow, wherein the seed crystal is dipped into the melt after the temperature of the seed crystal is raised close to the temperature of the melt by preheating with a heat insulating tube arranged around the seed crystal, and the single crystal is pulled without forming a neck.

4. A method for pulling a single crystal according to claim 3, wherein the seed crystal is preheated additionally using an auxiliary heating means for gradually raising the temperature of a front portion of the seed crystal.

5. A method for pulling a single crystal according to claim 1, 2, or 4, wherein a laser beam is used for raising the temperature of the seed crystal.

6. A method for pulling a single crystal according to claim 1, 2, or 4, wherein an incoherent light is used for raising the temperature of the seed crystal.

7. A method for pulling a single crystal according to claim 6, wherein an incoherent light having a wave length of 0.6 μm or more is used for raising the temperature of the seed crystal.

8. An apparatus for pulling a single crystal, wherein a holder for holding a seed crystal is connected to a pulling axis, having an auxiliary heater for raising the temperature of the front portion of the seed crystal before the seed crystal held by the holder is dipped into a melt.

9. An apparatus for pulling a single crystal according to claim 8, which has a laser beam generator as the auxiliary heater and has a window portion formed for inducing a laser beam emitted from the laser beam generator to the seed crystal.

10. An apparatus for pulling a single crystal according to claim 8, which has an incoherent, light generating-inducing apparatus as the auxiliary heater, comprising an incoherent light generator and an inducing means for inducing an incoherent light generated by the incoherent light generator to the vicinity of the seed crystal.

11. An apparatus for pulling a single crystal according to claim 10, which has an infrared rays generating-inducing apparatus as the auxiliary heater, comprising an infrared rays generator and an inducing means for inducing an infrared rays generated by the infrared rays generator to the vicinity of the seed crystal.

12. An apparatus for pulling a single crystal according to claim 10 or 11, wherein the inducing means includes a cylindrical body made of a material selected from among quartz, sapphire, kovar glass, $CaF_2$, NaCl, KCl, KBr, CsBr, and CsI.

13. An apparatus for pulling a single crystal according to claim 12, wherein a ratio of a diameter of the cylindrical body constituting the inducing means to a diameter of the front of the seed crystal is 1–3.

14. An apparatus for pulling a single crystal, wherein a holder for holding a seed crystal is connected to a pulling axis, having a heat insulating tube surrounding the seed crystal, which is attached to the holder.

15. An apparatus for pulling a single crystal according to claim 14, which includes an auxiliary heating means for raising the temperature of a front portion of the seed crystal before the seed crystal held by the holder is dipped into a melt.

16. An apparatus for pulling a single crystal according to claim 15, wherein the lower end portion of the heat insulating tube is located at a lower level than the lower end portion of the seed crystal held by the holder.

17. An apparatus for pulling a single crystal according to claim 14, wherein the lower end portion of the heat insulating tube is located at a lower level than the lower end portion of the seed crystal held by the holder.

* * * * *